(12) United States Patent
Chang et al.

(10) Patent No.: US 6,638,441 B2
(45) Date of Patent: Oct. 28, 2003

(54) METHOD FOR PITCH REDUCTION

(75) Inventors: Ching-Yu Chang, I-Lan (TW); Wei-Ming Chung, Taipei (TW)

(73) Assignee: Macronix International Co., Ltd., Hsin-Chu (TW)

(*) Notice: Subject to any disclaimer, the term of this patent is extended or adjusted under 35 U.S.C. 154(b) by 116 days.

(21) Appl. No.: 10/036,362

(22) Filed: Jan. 7, 2002

(65) Prior Publication Data

US 2003/0127426 A1 Jul. 10, 2003

(51) Int. Cl.[7] .................................. H01L 21/302
(52) U.S. Cl. ........................ 216/46; 216/49; 216/51; 216/72; 438/696; 438/946; 438/947; 438/952
(58) Field of Search ......................... 216/38, 39, 46, 216/47, 49, 51, 67, 72; 438/696, 736, 737, 738, 946, 947, 952

(56) References Cited

U.S. PATENT DOCUMENTS

| | | | | | |
|---|---|---|---|---|---|
| 5,420,067 A | * | 5/1995 | Hsu | ............................ | 438/700 |
| 5,618,383 A | * | 4/1997 | Randall | ........................ | 430/314 |
| 5,795,830 A | * | 8/1998 | Cronin et al. | ................ | 438/696 |
| 6,063,688 A | * | 5/2000 | Doyle et al. | ................. | 438/424 |
| 6,093,627 A | * | 7/2000 | Sung | ............................ | 438/586 |
| 6,337,266 B1 | * | 1/2002 | Zahorik | ........................ | 438/618 |
| 6,413,812 B1 | * | 7/2002 | Harshfield | ................... | 438/237 |
| 6,482,731 B1 | * | 11/2002 | Juengling | .................... | 438/618 |

* cited by examiner

Primary Examiner—Anita Alanko

(57) ABSTRACT

A method for pitch reduction is disclosed. The method can form a pattern with a pitch ⅓ the original pitch formed by available photolithography technologies by only using one photo mask or one pattern transfer process, self-aligned etching back processes, and conventional deposition processes. By choosing appropriate layers to be deposited and etched, the pattern can be an etching mask or it can be a device structure itself.

20 Claims, 6 Drawing Sheets

METHOD FOR PITCH REDUCTION

BACKGROUND OF THE INVENTION

1. Field of the Invention

The present invention relates to a method for pitch reduction, and more particularly to a method for forming a device structure with a tiny dimension.

2. Description of the Related Art

In semiconductor manufacture, microlithography technologies are used in the formation of integrated circuits on a semiconductor wafer. During a lithographic process, a form of radiant energy, such as ultraviolet light, is passed through a mask or reticle and onto the semiconductor wafer. The reticle contains opaque and transparent regions formed in a desired pattern. A grating pattern, for instance, may be used to define parallel spaced conducting lines on a semiconductor wafer. The ultraviolet light exposes the reticle pattern on a layer of resist formed on the wafer. The resist is then developed for removing either the exposed portions of resist for a positive resist or the unexposed portions of resist for a negative resist. The patterned resist can then be used during a subsequent semiconductor fabrication process such as ion implantation or etching.

As microcircuit densities have increased, the size of the features of semiconductor devices have decreased to the submicron level. These submicron features may include the width and spacing of metal conducting lines or the size of various geometric features of semiconductor devices. The requirement of submicron features has necessitated the development of improved microlithographic processes and systems. As an example, phase shifting microphotolithographic processes use phase shifting reticles to phase shift the exposure radiation at the edges of a pattern to increase the image contrast. Other sub-micron microlithographic processes include e-beam lithography technologies and x-ray lithography technologies.

However, the native limits of the sub-micron microlithographic processes mentioned above are still unavoidable and are hard to overcome. As the size scale of various geometric features of semiconductor devices reaches 0.18 micron, 0.13 micron or even a tinier scale, the problems will be tougher and hence there is a need for new strategy to overcome the native limits of modern sub-micron microlithographic processes till the unveiling the new and revolutionary processes.

SUMMARY OF THE INVENTION

It is therefore an object of the invention to provide a method for pitch reduction that can shrink the line width of modern integrated circuits further with available photolithography technologies.

It is another object of this invention to provide a method for pitch reduction that can form a pattern with a pitch ⅓ the original pitch formed by available photolithography technologies.

It is a further object of this invention to provide a method for pitch reduction having outstanding critical dimension and line position controls and without problems of complexity and overlay.

In one embodiment of this invention, the invention uses a method for pitch reduction, the method can form a pattern with a pitch ⅓ the original pitch formed by available photolithography technologies by only using one photo mask or one pattern transfer process, self-aligned etching back processes, and conventional deposition processes. By choosing appropriate layers to be deposited and etched, the pattern can be an etching mask or it can be a device structure itself. The method comprises the steps of providing a substrate having a pattern of a photoresist layer thereon, wherein said pattern comprises a plurality of equidistance lines and the width of each said equidistance line equals to the pitch of two adjacent said equidistance lines, forming a first layer over said pattern and said substrate; etching back said first layer to expose said substrate, forming a second layer over said pattern, said first layer and said substrate, etching back said second layer to expose said pattern and said first layer, removing said pattern, forming a third layer over said first layer, said second layer and said substrate; etching back said third layer to expose said substrate, forming a fourth layer over said first layer, said second layer, said third layer and said substrate, wherein the material of said fourth layer is the same with the material of said first layer, etching back said fourth layer to expose said first layer, said second layer and said third layer, and removing said second layer and said third layer.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1A:
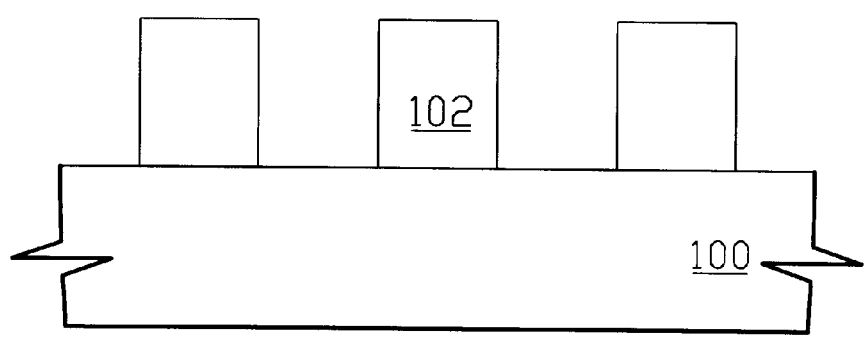
FIG. 1A shows a result of forming a pattern of a layer on a substrate.

Referring to FIG. 1A, a pattern of a layer 102 is formed on a substrate 100. The pattern comprises a plurality of defined and equidistance lines. The spacing or pitch of the defined and equidistance lines equals to the width of the defined and equidistance lines. To overcome the native photolithography limit, the pitch or the width of the defined and equidistance lines should be about the resolution limit of modern photolithography processes utilized by present semiconductor sector or the minimum line width achieved by various and available methods. For example, the pitch can be about 0.18 micron or even a tinier feature of about 0.13 micron. However, the pitch scale should not be limited as the scales set forth while photolithography technologies still advance further. The substrate 100 could be a dielectric layer, a conductive layer, an integrated circuit and other various substrates, and it depends on various applications of this invention.

Figure 1B:
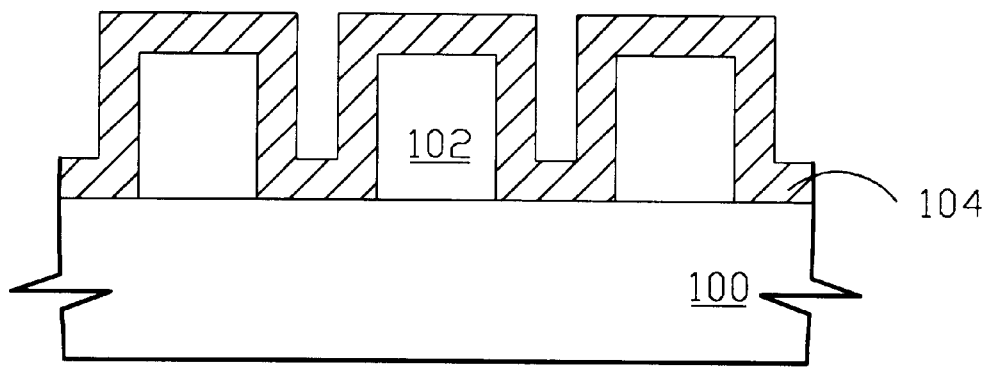
FIG. 1B shows a result of conformally forming a layer over the substrate shown in FIG. 1A.

In one embodiment of this invention, the layer 102 comprises a photoresist layer such as a deep ultraviolet photoresist (DUV) layer formed by conventional methods. The defined and equidistance lines shown in FIG. 1A can be formed by conventional photolithography processes. Referring to FIG. 1B, a layer 104 is formed over substrate 100. The layer 104 can be a dielectric layer such as an oxide layer or a silicon nitride layer formed by conventional methods. The thickness of the layer 104 is preferably about ⅓ the pitch shown in FIG. 1A. The layer 102 can also be a dielectric layer having a high etching selectivity with the layer 104. That is, if the layer 102 is an oxide layer, then the layer 104 can be a silicon nitride layer.

Figure 1C:
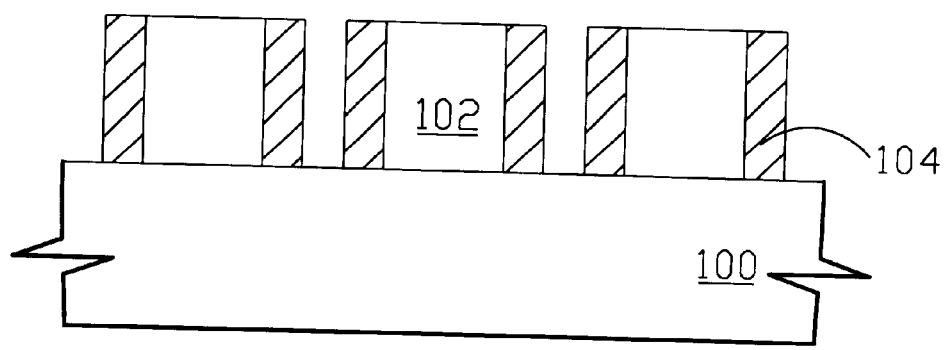
FIG. 1C shows a result of anisotropically etching the conformally formed layer shown in FIG. 1B.
Figure 1D:
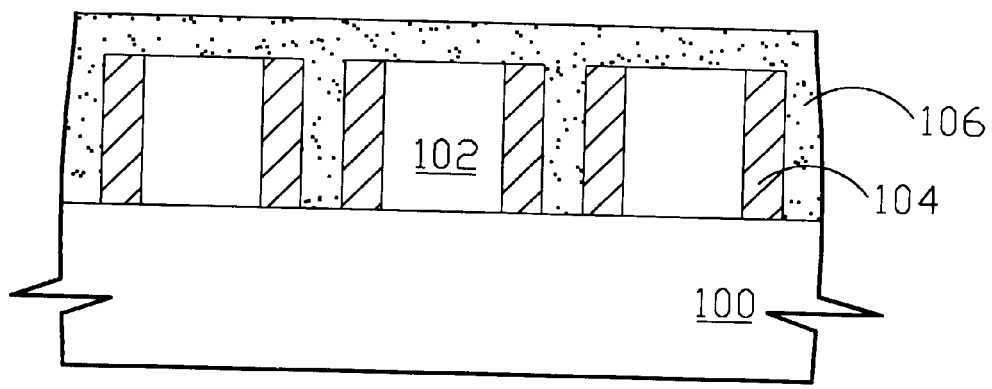
FIG. 1D shows a result of conformally forming a layer over the structure shown in FIG. 1C.

Referring to FIG. 1C, the layer 104 is anisotropically etched back to expose the substrate 100 and the layer 102 by using conventional dry etching methods that used to etch dielectric layers such as an oxide layer or a silicon nitride layer. As shown in FIG. 1C, spacers having a width of ⅓ the pitch shown in FIG. 1A are formed adjacent the sidewalls of the defined and equidistance lines. Referring to FIG. 1D, a layer 106 is formed over the structure shown in FIG. 1C. The layer 106 preferably comprises, but is not limited to: a non-photosensitive polymer layer such as a polymer layer used as a bottom anti-reflection coating (BARC) layer. In fact the requirements of the layer 106 are non-photosensitivity and high etching selectivity with the layer 104. The thickness of the layer 106 is preferably about ⅓ the pitch shown in FIG. 1A.

Figure 1E:
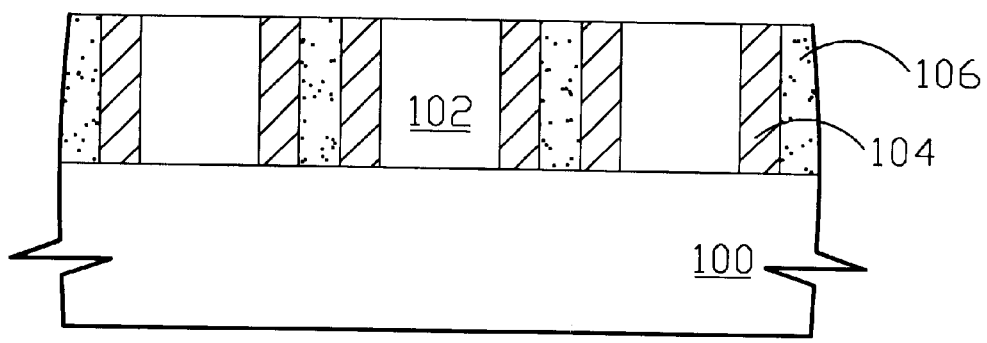
FIG. 1E shows a result of anisotropically etching the conformally formed layer shown in FIG. 1D.
Figure 1F:
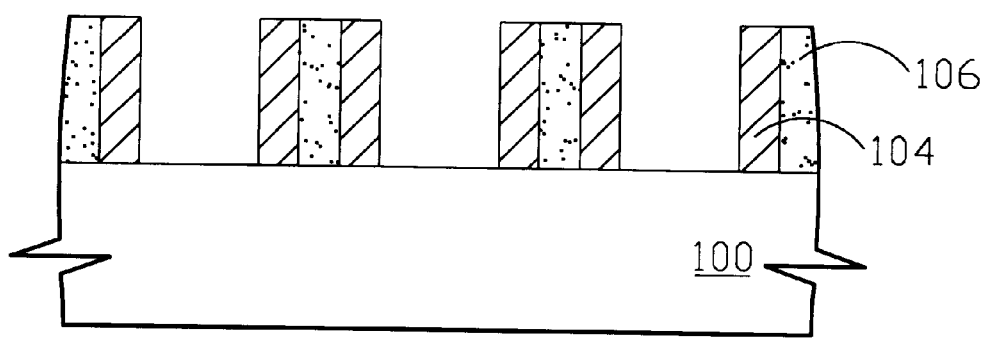
FIG. 1F shows a result of removing the pattern of the layer shown in FIGS. 1A–1E.

Referring to FIG. 1E, the layer 106 is anisotropically etched back to expose the layer 102 and the layer 104 by conventional methods such as a dry strip method that use oxygen plasma. Referring to FIG. 1F, if the layer 102 is a positive photoresist layer, the layer 102 is removed by conventional development methods. It is noted that no mask is needed in the removal of the layer 102. Because the layer 106 has non-photosensitivity, the layer 106 will remain after the removal of the layer 102.

Figure 1G:
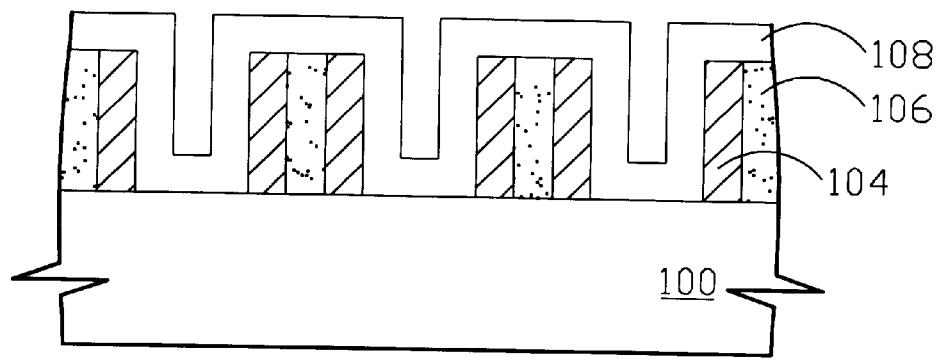
FIG. 1G shows a result of conformally forming a layer over the structure shown in FIG. 1F.
Figure 1H:
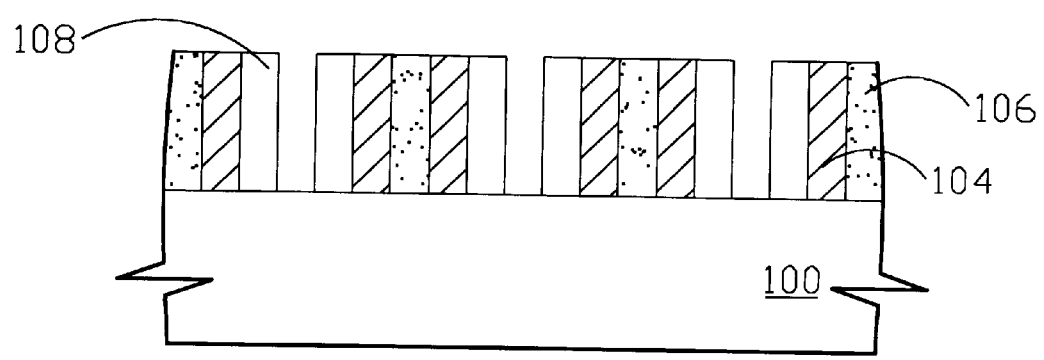
FIG. 1H shows a result of anisotropically etching the conformally formed layer shown in FIG. 1G.

Referring to FIG. 1G, a layer 108 is conformally formed over the structure shown in FIG. 1F. The thickness of the layer 108 is preferably about ⅓ the pitch shown in FIG. 1A. The layer 108 can also be a non-photosensitive polymer layer such as a polymer layer used as a bottom anti-reflective coating (BARC) layer or a layer having non-photosensitivity and high etching selectivity with the layers in contact. Referring to FIG. 1H, the layer 108 is anisotropically etched back by conventional methods to expose the substrate 100.

Figure 1I:
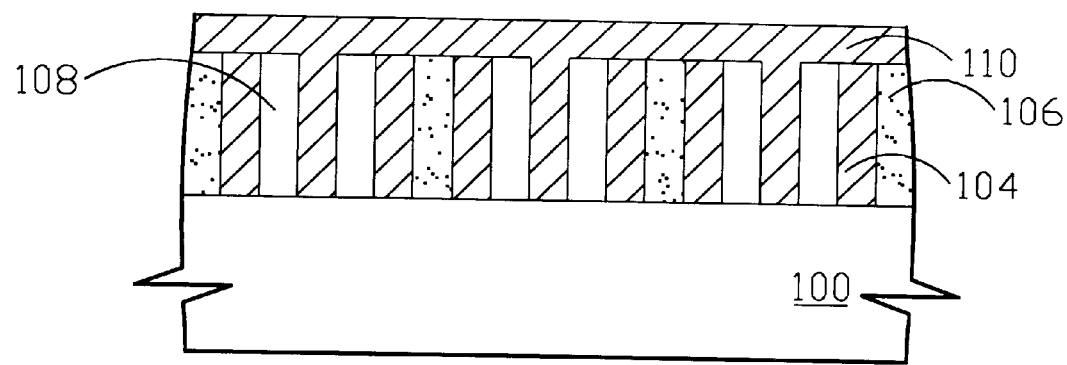
FIG. 1I shows a result of conformally forming a layer over the structure shown in FIG. 1H.
Figure 1J:
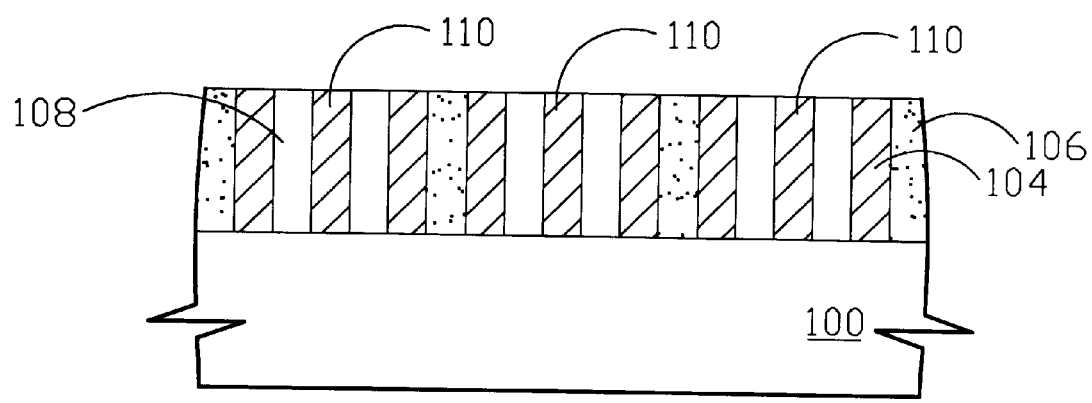
FIG. 1J shows a result of anisotropically etching the conformally formed layer shown in FIG. 1I.

Referring to FIG. 1I, a layer 110 is formed over the structure shown in FIG. 1H. The material of the layer 110 is the same with the material of the layer 104. Then as shown in FIG. 1J, the layer 110 is anisotropically etched back to expose the layer 104, the layer 106 and the layer 108 by the methods set forth or other conventional methods.

Figure 1K:
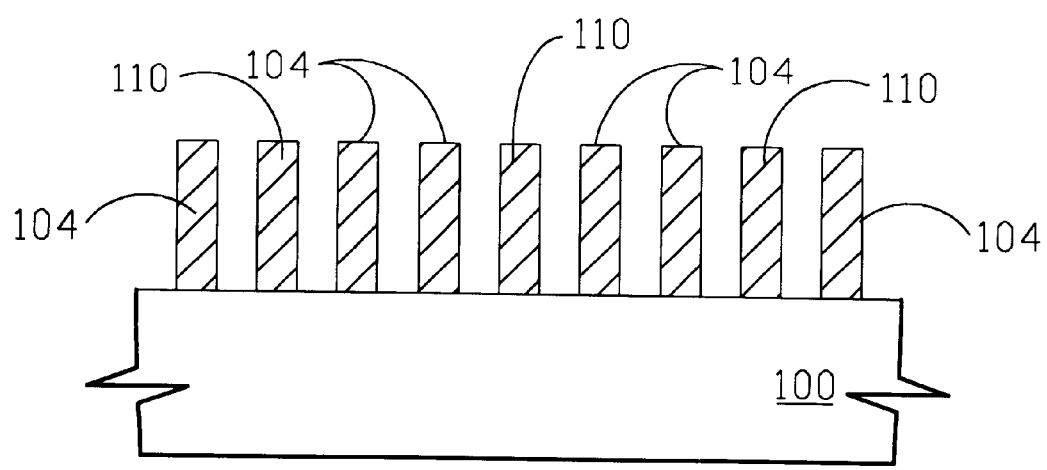
FIG. 1K shows a result of forming a pattern with a pitch ⅓ the pitch shown in FIG. 1A.

Referring to FIG. 1K, the layers 106 and 108 are sequentially removed and a pattern of the layer 104 and the layer 110 is formed. If the layer 106 and the layer 108 are composed of the same non-photosensitive polymer material and t the layers 106 and 108 can be removed by a dry stripping process that utilizes oxygen plasma. The pattern of the layer 104 and the layer 110 has a plurality of equidistance lines having a width only ⅓ the width of the equidistance lines of the pattern of the layer 102. The pattern of the layer 104 and the layer 110 can be used as an etching mask to form various device structures with a tiny dimension such as gate electrodes or holes. It is noted that the formation of the pattern of the layer 104 and the layer 110 shown in FIG. 1K only uses one photo mask or one pattern transfer process which will be limited by the photolithography limit.

In another embodiment of this invention, the layer 102 shown in FIG. 1A can be a photoresist layer or a dielectric layer such as an oxide layer or a silicon nitride layer. The pattern of the layer 102 can be formed by conventional photolithography and etching processes. The pattern comprises a plurality of equidistance lines. The spacing or pitch of the defined and equidistance lines equals to the width of the defined and equidistance lines. To overcome the native photolithography limit, the pitch or the width of the equidistance lines should be about the resolution limit of modern photolithography processes utilized by present semiconductor sector. For example, the pitch can be about 0.18 micron or even a tinier feature of about 0.13 micron. However, the pitch scale should not be limited as the scales set forth while photolithography technologies still advance further. The substrate 100 depends on various applications of this invention.

The layer 104 shown in FIG. 1B preferably comprises a conductive layer such as a polysilicon layer or a metal layer formed by conventional methods. The thickness of the layer 104 is preferably about ⅓ the pitch shown in FIG. 1A. The layer 104 should have high etching selectivity with the layers in contact. Then as shown in FIG. 1C, the layer 104 is etched back to expose the substrate 100 and the layer 102 by conventional anisotropic etching methods. Next as shown in FIG. 1D, the layer 106 is formed by conventional methods and it can be a dielectric layer such as an oxide layer or a silicon nitride layer having a high etching selectivity with the layers in contact. The thickness of the layer 106 is preferably about ⅓ the pitch shown in FIG. 1A. The layer 106 is then etched back by conventional anisotropic etching methods as shown in FIG. 1E. The layer 102 is next removed by conventional methods as shown in FIG. 1F. The layer 108 is then formed by conventional methods and it can be a dielectric layer such as an oxide layer or a silicon nitride layer having a high etching selectivity with the layers in contact as shown in FIG. 1G. The thickness of the layer 108 is preferably about ⅓ the pitch shown in FIG. 1A. The layer 108 is then etched back to expose the substrate 100 by conventional anisotropic etching methods as shown in FIG. 1H. The layer 110 is formed and etched back as shown in FIG. 1I and FIG. 1J. Finally, the layer 106 and the layer 108 are sequentially removed and a pattern of the layer 104 and the layer 110 is formed as shown in FIG. 1K. In this embodiment, the pattern of the layer 104 and the layer 110 can be a gate electrode pattern if the layer 104 and the layer 110 are polysilicon layers. That is, the demanding device structure with extremely tiny features is formed directly in this embodiment.

In one embodiment of this invention, the invention uses one photo mask and one pattern transfer process to form a pattern of photoresist layer with a pitch having a dimension of the resolution limit of modern photolithography processes. Then the invention uses four deposition and self-aligned etching back processes of layers having non-photosensitivity and high etching selectivity with the layers in contact to form an etching mask pattern with a tiny feature 1/3 the pitch dimension. The etching mask can be used to form various device structures with a tiny feature 1/3 the resolution limit of modern photolithography processes.

In another embodiment of this invention, the invention also uses one photo mask and one pattern transfer process to form a pattern of a layer with a pitch having a dimension of the resolution limit of modern photolithography processes. Then the invention uses four deposition and self-aligned etching back processes of layers having high etching selectivity with the layers in contact to directly form a pattern of the demanding device structure with a tiny feature 1/3 the pitch dimension.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method for pitch reduction, said method comprising:
   providing a substrate having a pattern of a photoresist layer thereon, wherein said pattern comprises a plurality of lines a;
   forming a first layer over said pattern and said substrate;
   etching back said first layer to expose said substrate;
   forming a second layer over said pattern, said first layer and said substrate;
   etching back said second layer to expose said pattern and said first layer;
   removing said pattern;
   forming a third layer over said first layer, said second layer and said substrate;
   etching back said third layer to expose said substrate;
   forming a fourth layer over said first layer, said second layer, said third layer and said substrate, wherein the material of said fourth layer is the same with the material of said first layer;
   etching back said fourth layer to expose said first layer, said second layer and said third layer; and
   removing said second layer and said third layer.

2. The method according to claim 1, wherein said photoresist layer comprises a deep ultraviolet photoresist layer.

3. The method according to claim 1, wherein said first layer and said fourth layer comprise a dielectric layer.

4. The method according to claim 1, wherein second layer and said third layer comprise a non-photosensitive polymer layer.

5. The method according to claim 1, wherein the thicknesses of said first layer, said second layer, said third layer and said fourth layer are preferably about 1/3 the pitch of two adjacent said equidistance lines.

6. The method according to claim 3, wherein said dielectric layer comprises an oxide layer.

7. The method according to claim 3, wherein said dielectric layer comprises a silicon nitride layer.

8. A method for pitch reduction, said method comprising:
   providing a substrate having a pattern of a dielectric layer thereon, wherein said pattern comprises a plurality of equidistance lines and the width of each said equidistance line equals to the pitch of two adjacent said equidistance lines;
   forming a first layer over said pattern and said substrate;
   etching back said first layer to expose said substrate;
   forming a second layer over said pattern, said first layer and said substrate;
   etching back said second layer to expose said pattern and said first layer;
   removing said pattern;
   forming a third layer over said first layer, said second layer and said substrate;
   etching back said third layer to expose said substrate;
   forming a fourth layer over said first layer, said second layer, said third layer and said substrate, wherein the material of said fourth layer is the same with the material of said first layer;
   etching back said fourth layer to expose said first layer, said second layer and said third layer; and
   removing said second layer and said third layer.

9. The method according to claim 8, wherein said dielectric layer comprises an oxide layer.

10. The method according to claim 8, wherein said dielectric layer comprises a silicon nitride layer.

11. The method according to claim 8, wherein said first layer and said fourth layer comprise polysilicon layers.

12. The method according to claim 8, wherein the thicknesses of said first layer, said second layer, said third layer and said fourth layer are preferably about 1/3 the pitch of two adjacent said equidistance lines.

13. A method for pitch reduction, said method comprising:
   providing a substrate having a pattern of a layer thereon, wherein said pattern comprises a plurality of equidistance lines and the width of each said equidistance line equals to the pitch of two adjacent said equidistance lines;
   forming a first layer over said pattern and said substrate, wherein the thickness of said first layer is about 1/3 the pitch of two adjacent said equidistance lines;
   etching back said first layer to expose said substrate;
   forming a second layer over said pattern, said first layer and said substrate, wherein the thickness of said second layer is about 1/3 the pitch of two adjacent said equidistance lines;
   etching back said second layer to expose said pattern and said first layer;
   removing said pattern;
   forming a third layer over said first layer, said second layer and said substrate, wherein the thickness of said third layer is about 1/3 the pitch of two adjacent said equidistance lines;
   etching back said third layer to expose said substrate;
   forming a fourth layer over said first layer, said second layer, said third layer and said substrate, wherein the material of said fourth layer is the same with the material of said first layer and the thickness of said fourth layer is about ⅓ the pitch of two adjacent said equidistance lines;

etching back said fourth layer to expose said first layer, said second layer and said third layer; and removing said second layer and said third layer.

14. The method according to claim 13, wherein said layer is a photoresist layer, said first layer and said fourth layer are oxide layers, and said second layer and said third layer are non-photosensitive polymer layers.

15. The method according to claim 13, wherein said layer is a photoresist layer, said first layer and said fourth layer are silicon nitride layers, and said second layer and said third layer are non-photosensitive polymer layers.

16. The method according to claim 13, wherein said layer is an oxide layer, said first layer and said fourth layer are polysilicon layers, said second layer and said third layer are silicon nitride layers.

17. The method according to claim 13, wherein said layer is an oxide layer, said first layer and said fourth layer are polysilicon layers, said second layer is a silicon nitride layer, and said third layer is an oxide layers.

18. The method according to claim 13, wherein said layer is a silicon nitride layer, said first layer and said fourth layer are polysilicon layers, said second layer and said third layer are oxide layers.

19. The method according to claim 13, wherein said layer is a silicon nitride layer, said first layer and said fourth layer are polysilicon layers, said second layer is an oxide layer, and said third layer is a silicon nitride layer.

20. The method according to claim 13, wherein said first layer and said fourth layer are metal layers.

* * * * *